United States Patent [19]
Choi

[11] Patent Number: 5,780,330
[45] Date of Patent: Jul. 14, 1998

[54] SELECTIVE DIFFUSION PROCESS FOR FORMING BOTH N-TYPE AND P-TYPE GATES WITH A SINGLE MASKING STEP

[75] Inventor: Jeong Yeol Choi, Fremont, Calif.

[73] Assignee: Integrated Device Technology, Inc., Santa Clara, Calif.

[21] Appl. No.: 671,984

[22] Filed: Jun. 28, 1996

[51] Int. Cl.$^6$ ............................................. H01L 21/8238
[52] U.S. Cl. ........................... 438/232; 438/532; 438/919
[58] Field of Search .................................. 438/220, 231, 438/232, 233, 275, 532, 919

[56] References Cited

U.S. PATENT DOCUMENTS

| | | | |
|---|---|---|---|
| 4,555,842 | 12/1985 | Levinstein et al. | 438/232 |
| 4,637,836 | 1/1987 | Flatley et al. | 438/232 |
| 4,703,552 | 11/1987 | Baldi et al. | 438/232 |
| 5,021,356 | 6/1991 | Henderson et al. | 438/532 |
| 5,278,085 | 1/1994 | Maddox, III et al. | 438/224 |
| 5,393,679 | 2/1995 | Yang | 438/217 |

Primary Examiner—Chandra Chaudhari
Attorney, Agent, or Firm—Skjerven, Morrill, Morrill, MacPherson, Franklin & Friel

[57] ABSTRACT

First and second conductivity type regions are produced in a polysilicon layer using only a single masking step. In one embodiment, the polysilicon layer is doped to a first conductivity type. A first oxide layer is then formed and patterned over the polysilicon layer to cover a first region and expose a second region of the polysilicon layer. The exposed second region of the polysilicon layer is then counter-doped, with the first oxide layer acting as a mask to prevent counter-doping of the underlying first region of the polysilicon layer. In accordance with the present invention, n-channel devices with n-type or p-type polysilicon gates and p-channel devices with p-type or n-type polysilicon gates can be formed without having to add a single process step. Thus, n-channel and p-channel devices with two different threshold voltages can be realized without adding a single process step.

29 Claims, 7 Drawing Sheets

SELECTIVE DIFFUSION PROCESS FOR FORMING BOTH N-TYPE AND P-TYPE GATES WITH A SINGLE MASKING STEP

FIELD OF THE INVENTION

This invention relates generally to integrated semiconductor devices and more particularly to a fabrication process for forming both first and second conductivity type regions in a polysilicon layer.

BACKGROUND OF THE INVENTION

Polycrystalline silicon (hereinafter referred to as polysilicon) and single crystal silicon are both resistive in nature but can become conductive if doped with impurity atoms.

N-type polysilicon has been widely used for the gates of both n-channel and p-channel semiconductor devices. P-channel devices thus formed are buried-channel devices. It is known that there are severe limitations in scaling down the size of buried-channel devices to below one-half of a micrometer (0.5 µm). These limitations are minimized in surface-channel devices.

To form surface-channel devices, n-type polysilicon gates are used for n-channel devices and p-type polysilicon gates are used for p-channel devices. P-channel and n-channel devices are often formed together in the same circuit. This has resulted in dual-gate devices in which a portion of a single layer of polysilicon is doped to n-type to form n-type polysilicon gates and another portion of the single layer of polysilicon is doped to p-type to form p-type polysilicon gates.

FIGS. 1a to 1c illustrate a prior art method of forming a dual-gate device. Shown in FIG. 1a is a structure which includes a semiconductor substrate 10, such as silicon, with a p-well 12 and n-well 14. Overlying substrate 10 are oxide layers 15 and 15'. Overlying oxide layers 15, 15' are polysilicon gates 16, 18, respectively, formed from a single layer of polysilicon. Overlying polysilicon layer 16 is a mask layer 20. The surface 22 of substrate 10 is appropriately masked (not shown). The masked structure is then doped with a p-type dopant forming p-type source/drain regions 24, 26 and at the same time doping polysilicon layer 18 to form a p-type polysilicon gate (also 18) by methods well known to those skilled in the art.

Mask layer 20 overlying polysilicon layer 16 is stripped exposing polysilicon layer 16, and a mask layer 32 (FIG. 1b) is formed overlying p-type polysilicon gate 18. Surface 22 is also remasked (not shown). The masked structure is then doped with an n-type dopant, such as phosphorus or arsenic, forming n-type source/drain regions 28, 30 and at the same time doping polysilicon layer 16 to form an n-type polysilicon gate (also 16) by methods well known to those skilled in the art. The resulting structure is shown in FIG. 1b.

The masking is then stripped and a dual-gate device 8 is formed as shown in FIG. 1c. Dual-gate device 8 includes p-channel device 34 having p-type polysilicon gate 18 and n-channel device 36 having n-type polysilicon gate 16.

Typically, the p-type source/drain regions 24, 26 are doped with boron fluoride ions ($BF_2$). However, the fluorine in $BF_2$ enhances the penetration of boron through gate oxide layer 15' and into n-type channel 25 (see FIG. 1c). This causes undesirable fluctuations in the threshold voltage (the voltage applied to gate 18 at which n-type channel 25 becomes conductive). Typically, nitrogen is incorporated through thermal nitridation or implantation into gate oxide 15' or polysilicon layer 18 to reduce the penetration of boron through gate oxide layer 15'. However, nitrogen incorporation degrades p-channel mobility which is also undesirable. As an alternative to $BF_2$, boron can be used to dope p-type source/drain regions 24, 26. However, the fluorine in $BF_2$ retards the diffusion of boron in silicon; thus, using boron instead of $BF_2$ produces deeper p-type source/drain regions 24, 26, which is undesirable. Designers must choose between $BF_2$ which produces threshold voltage fluctuations and boron which produces relatively deep p-type source/drain regions 24, 26. The art needs a process for forming p-channel devices with stable threshold voltages and shallow p-type source/drain regions.

Although the method shown in FIGS. 1a to 1c of forming dual-gate devices is simple and cost effective, the dual-gate device produced suffers from insufficient doping at the bottoms 40, 40' (FIG. 1c) of polysilicon gates 16, 18, respectively. This is because the doping concentration used to form shallow source drain regions 24, 26 and 28, 30 is inadequate to sufficiently dope polysilicon gates 18 and 16, respectively, which are doped at the same time. The relatively low doping concentration at the bottoms 40, 40' of gates 16, 18, respectively, causes gate oxide layers 15, 15' to act electrically as though they are much thicker than they actually are. This results in a loss of driving capability of the device.

To provide adequate dopant concentrations, it is known to dope the polysilicon layer separately from the source/drain regions, and then pattern the polysilicon region to form the n-type and p-type polysilicon gates. Maddox, III et al., U.S. Pat. No. 5,278,085, (Maddox) incorporated herein by reference in its entirety, discloses a prior art process for doping a polysilicon layer separately from the source/drain regions. (See FIGS. 1A to 1C in Maddox and the related discussion.)

However, the two step masking process disclosed in Maddox increases the probability of misalignment and particulate contamination, especially as device features decrease in size to below 0.5 µm. Thus, it is desirable to form a process which uses a single masking step.

In Maddox, a single mask process for forming both n-type and p-type gates in a layer of polysilicon is also disclosed. (See FIGS. 3A to 3C in Maddox and the related discussion). One disadvantage of this method is that there is substantial counter-doping of the n-type portion (18B of FIG. 3C in Maddox) by the p-type dopant during the blanket implant used to dope the adjoining polysilicon region (18A of FIG. 3C in Maddox).

Maddox, also describes another single mask process for manufacturing a dual-gate device (See FIGS. 2A to 2E in Maddox and the related discussion).

However, the method produces n-type and p-type polysilicon regions (18B, 18A of FIG. 2E in Maddox, respectively) with different thicknesses which is undesirable. In typical sub 0.5 µm devices, the gate oxide layer is not thick enough to allow too much over-etching of the thinner portion (18B of FIG. 2E in Maddox) while the thicker portion (18A of FIG. 2E in Maddox) is patterned.

The art needs a method for producing dual-gate devices using a single masking step wherein the n-type and p-type polysilicon portions are of the same thickness and are sufficiently doped to function effectively in their intended environment. Furthermore, the art needs a method in which $BF_2$ is used to produce shallow p-type source/drain regions in p-channel devices while threshold voltage stability and p-channel mobility is maintained.

SUMMARY OF THE INVENTION

In accordance with this invention, both first and second conductivity type regions are formed in a single layer of polysilicon using a single masking step. In one embodiment, a polysilicon layer is doped to a first conductivity type with a first dopant. A first oxide layer is formed and patterned over a first region of the polysilicon layer thus exposing a second region of the polysilicon layer. The exposed second region of the polysilicon layer is then counter-doped to a second conductivity type opposite the first conductivity type with a second dopant.

In one embodiment, the polysilicon layer is doped to the first conductivity type through ion implantation, and the second region of the polysilicon layer is counter-doped to the second conductivity type using dopant diffusion, with the first oxide layer masking the underlying first region of the polysilicon layer to prevent counter-doping of this first region.

In another embodiment, the first oxide layer is patterned by first depositing and patterning a photoresist mask to cover a first region and to expose a second region of the first oxide layer. Then, the exposed second region of the first oxide layer is stripped. Then, the photoresist mask is stripped.

In other embodiments, the first dopant is boron obtained from diboron hexahydride ($B_2H_6$) and the second dopant is phosphorus obtained from phosphorus oxychloride ($POCl_3$).

In alternative embodiments, a silicon substrate is doped to form an n-well and a p-well. An insulating layer is formed on the silicon substrate and the polysilicon layer is deposited on the insulating layer. A first conductivity type region and a second conductivity type region are formed in the polysilicon layer using the single masking step method as described above, where the first and second conductivity types are n-type and p-type. The polysilicon regions are patterned to form n-type and p-type polysilicon gates. Source/drain regions are formed in the n-well and the p-well thereby forming p-channel and n-channel devices.

In alternative embodiments, the first oxide layer prevents counter-doping of the underlying p-type or n-type polysilicon gate during the formation of the source/drain regions. This is particularly advantageous when using $BF_2$ to form p-type source/drain regions, as it minimizes boron penetration into the n-type channel underlying the first oxide layer and the associated degradation in threshold voltage stability.

In accordance with the present invention, n-channel and p-channel devices of two different threshold voltages can be realized without adding a single process step.

DESCRIPTION OF THE PREFERRED EMBODIMENTS

Figure 1A:
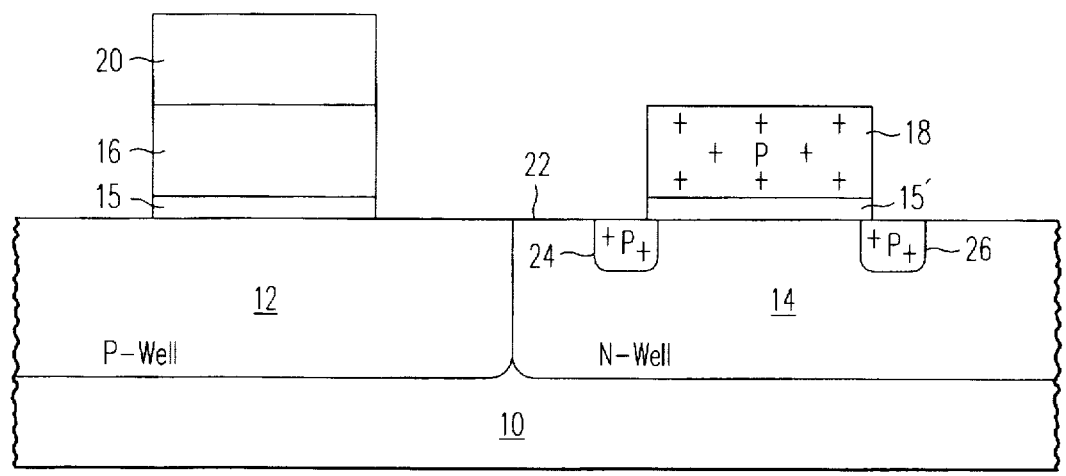
FIGS. 1a to 1c illustrate a prior art method for forming a dual-gate device wherein a polysilicon layer is doped at the same time that source/drain regions are formed.
Figure 1B:
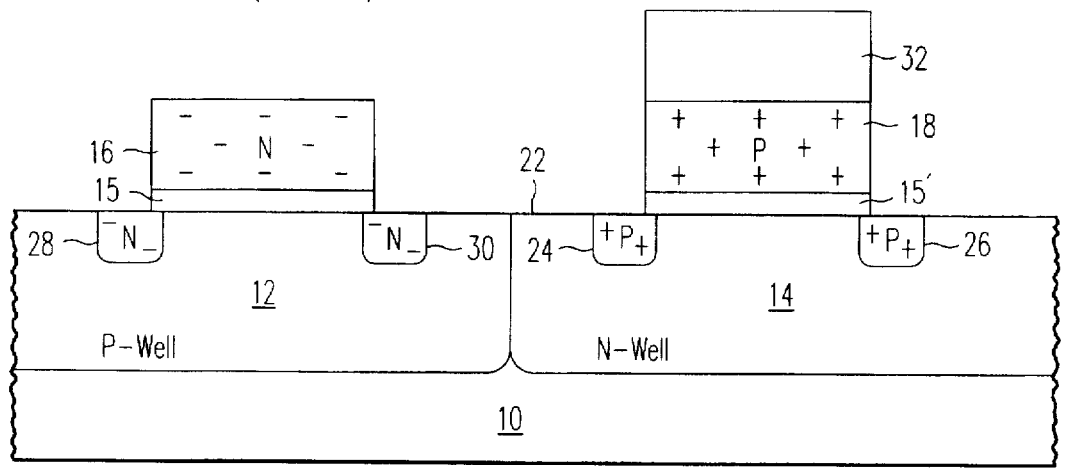
Figure 1C:
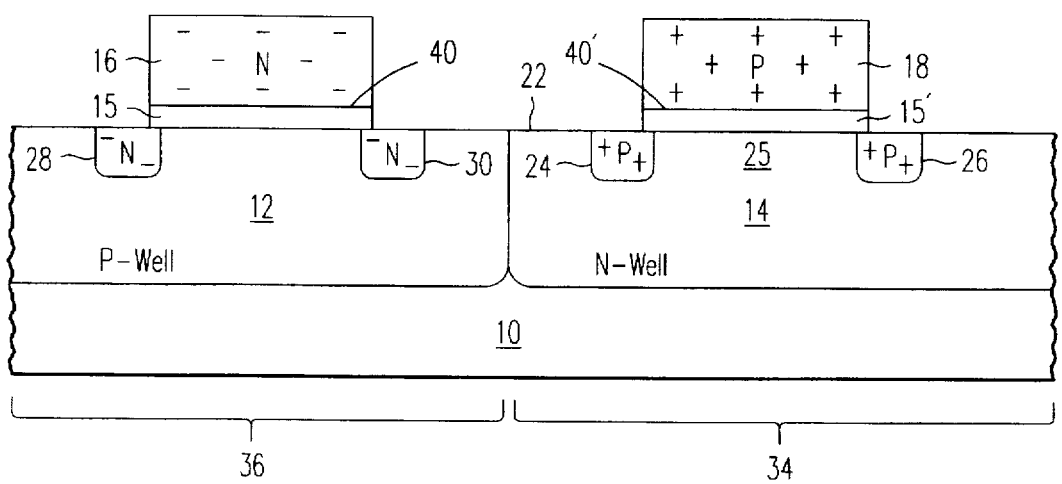
Figure 2A:
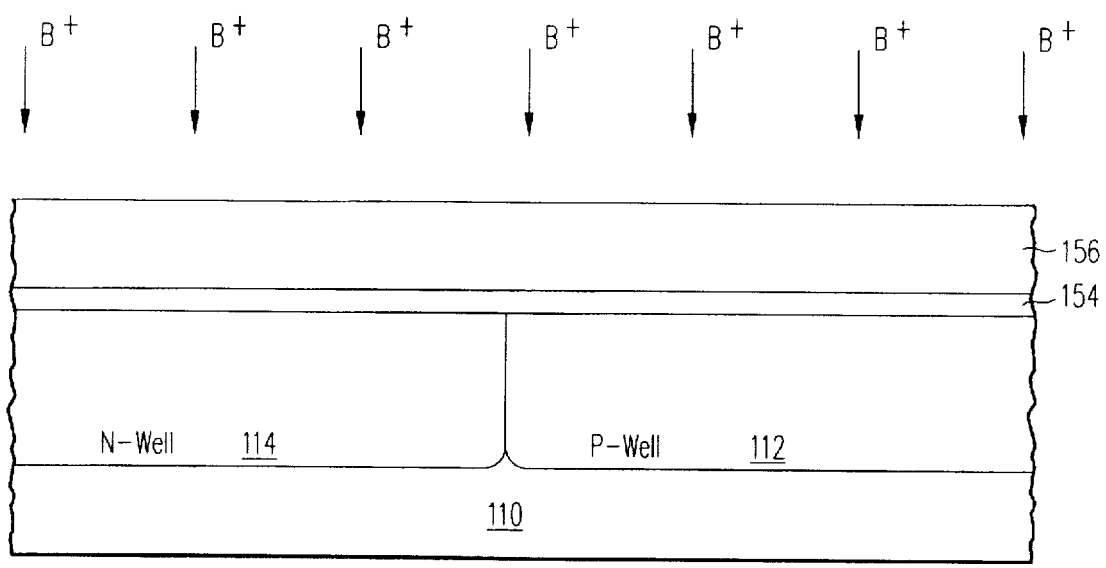
FIGS. 2a to 2d illustrate the formation of n-type and p-type polysilicon regions in a polysilicon layer using a single masking step in accordance with one embodiment of the present invention.

FIGS. 2a to 2d illustrate the formation of n-type and p-type polysilicon regions in a polysilicon layer using a single masking step in accordance with one embodiment of the present invention. As shown in FIG. 2a, a substrate 110, made of silicon for example, is doped to form p-well 112 and n-well 114 by methods well known to those skilled in the art. As an example, p-well 112 can be doped using boron ion implantation and n-well 114 can be doped using phosphorus ion implantation. An insulating layer 154, such as an oxide layer, is formed over substrate 110 and a polysilicon layer 156 is formed over insulating layer 154. Polysilicon layer 156 is subjected to a blanket boron implant, shown as $B^+$ in FIG. 2a, which renders polysilicon layer 156 to be p-type conductive. To attain the maximum boron concentration in polysilicon layer 156, the maximum practical boron implant dosage is used. Typically, the boron implant dosage is approximately $1 \times 10^{16}$ atoms/cm$^2$ or less. Further, to prevent boron ions from passing through polysilicon layer 156, insulating layer 154 and into the underlying n-well 114 and p-well 112, a relatively low implant energy is used for the blanket boron implant. For example, an implant energy of 10 kiloelectron volts (kev) or less is used.

Figure 2B:
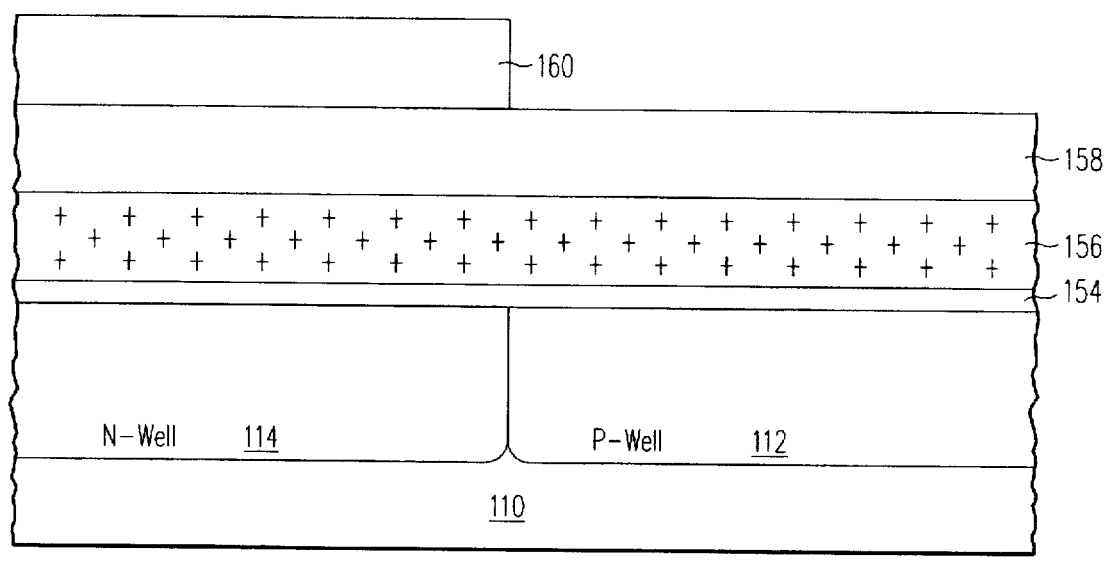

After the boron implant, a first oxide layer 158 (FIG. 2b) is formed over polysilicon layer 156. Oxide 158 can be thermally grown or deposited. As shown in FIG. 2b, a layer of photoresist is formed over first oxide layer 158, and a mask 160 is patterned from the photoresist to cover the region of first oxide layer 158 overlying n-well 114.

The exposed region of first oxide layer 158 is then stripped (FIG. 2c) using any of a number of well known processes to expose a portion 156b of polysilicon layer 156 overlying p-well 112. Mask 160 is then stripped resulting in the structure shown in FIG. 2c with a portion 158a of oxide layer 158 remaining over a portion 156a of polysilicon layer 156 overlying n-well 114.

The exposed portion 156b, which was doped to p-type by the boron implant, is then counter-doped to n-type using, in one embodiment, phosphorus oxychloride ($POCl_3$) as a diffusion source. Typically, the $POCl_3$ diffusion cycle temperature and time are 850° C. and 30 minutes, respectively. Using $POCl_3$ as a diffusion source, the exposed portion 156b is counter-doped up to the saturation point of phosphorus in polysilicon. The resulting structure, as shown in FIG. 2d, has a p-type portion 156a overlying n-well 114, and an n-type portion 156b overlying p-well 112.

In alternative embodiments, instead of performing a blanket boron implant (FIG. 2a) to render polysilicon layer 156 to be p-type conductive, a diffusion process is used. In one embodiment, diboron hexahydride ($B_2H_6$) is used as the diffusion source. To dope the bottom of polysilicon layer 156 to saturation, a relatively long diffusion cycle time is used. For example, a diffusion cycle temperature and time of 850° C. and 30 minutes, respectively, can be used.

In another embodiment, instead of doping portions 156a and 156b (FIG. 2d) to be p-type and n-type conductive, respectively, portions 156a and 156b are doped to be n-type and p-type conductive, respectively. This entails forming a photoresist mask over a region of oxide layer 158 (FIG. 2b) overlying p-well 112 (instead of forming mask 160 overlying n-well 114). The exposed region of oxide layer 158 is then removed to expose portion 156a of polysilicon layer 156 (instead of exposing portion 156b as in FIG. 2c). Then, the photoresist mask is stripped. Portion 156a is then counter-doped to be n-type conductive while the oxide remaining over portion 156b prevents counter-doping of portion 156b.

Figure 3A:
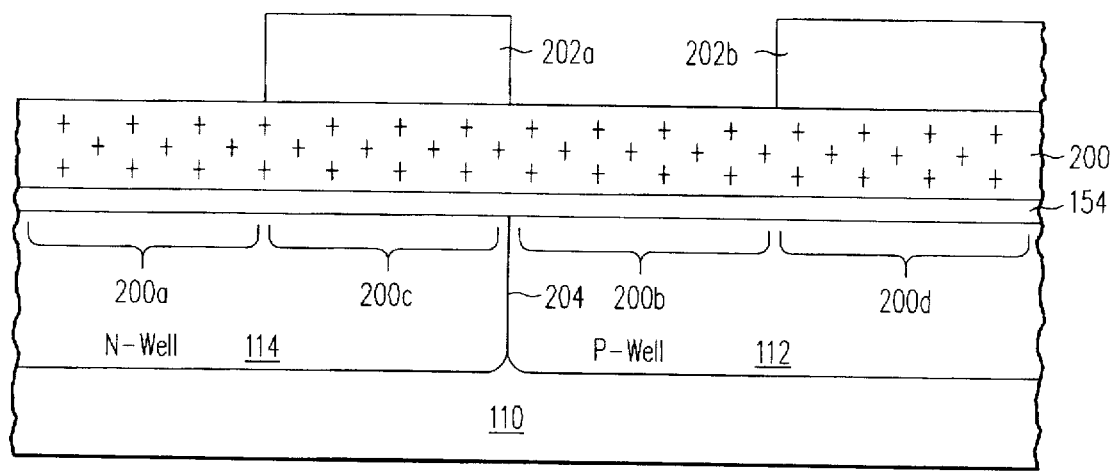
FIGS. 3a to 3c illustrate the formation of p-channel devices with p-type and n-type polysilicon gates and n-channel devices with n-type and p-type polysilicon gates in accordance with another embodiment of the present invention.
Figure 3B:
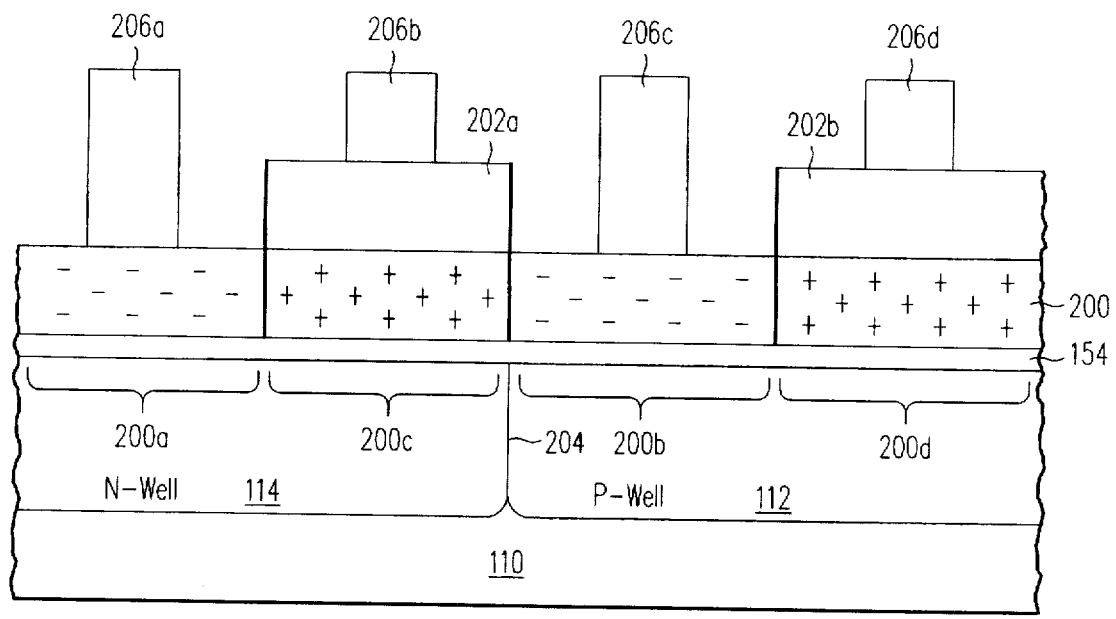
Figure 3C:
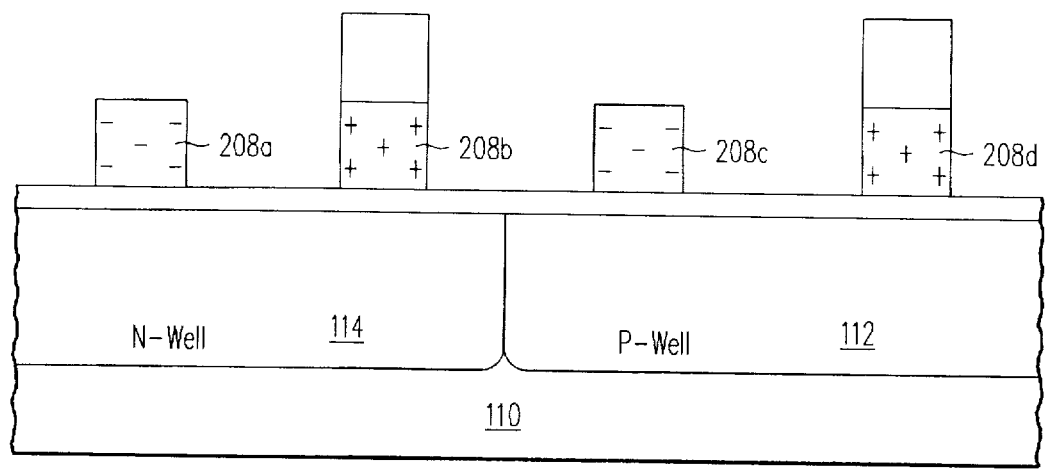

FIGS. 3a to 3c illustrate the formation of p-channel devices with p-type and n-type polysilicon gates and n-channel devices with n-type and p-type polysilicon gates in accordance with another embodiment of the present invention. In FIG. 3a, a polysilicon layer 200 is rendered to be p-type conductive by a blanket implant or by diffusion as discussed above in reference to FIG. 2a. An oxide layer is formed and patterned to form a first oxide portion 202a and a second oxide portion 202b. In particular, first oxide portion 202a overlies a portion of n-well 114 and second oxide portion 202b overlies a portion of p-well 112. First and second oxide portions 202a, 202b are patterned by forming masks (not shown) over portions 202a, 202b of an oxide layer, removing the exposed portions of the oxide layer, and then stripping the masks used to pattern the oxide layer.

First and second oxide portions 202a, 202b define four polysilicon portions (200a, 200b, 200c, 200d) of polysilicon layer 200. In particular, first polysilicon portion 200a and second polysilicon portion 200b overlie n-well 114 and p-well 112, respectively, and are uncovered by first and second oxide portions 202a, 202b. Third polysilicon portion 200c overlies n-well 114 and is covered by first oxide portion 202a. Fourth polysilicon portion 200d overlies p-well 112 and is covered by second oxide portion 202b.

The exposed polysilicon portions 200a, 200b are then counter-doped to be n-type conductive, for example, using POCl$_3$ as a diffusion source, as shown in FIG. 3b. Masks 206a, 206b, 206c and 206d, for example photoresist masks, are then formed over polysilicon portion 200a, oxide portion 202a, polysilicon portion 200b and oxide portion 202b, respectively. The exposed polysilicon and oxide is then removed and masking is stripped (FIG. 3c) thereby leaving n-type and p-type polysilicon gates 208a, 208b over n-well 114, respectively, and n-type and p-type polysilicon gates 208c, 208d over p-well 112, respectively. Processing continues until the desired device is fabricated. For example, p-channel devices with n-type and p-type polysilicon gates 208a, 208b, respectively, and n-channel devices with n-type and p-type polysilicon gates 208c, 208d, respectively, are fabricated. Thus, in accordance with one embodiment of the present invention, n-channel devices with n-type or p-type polysilicon gates and p-channel devices with p-type or n-type polysilicon gates are fabricated without having to add a single process step as compared to the embodiment illustrated in FIGS. 2a–2d.

Figure 4A:
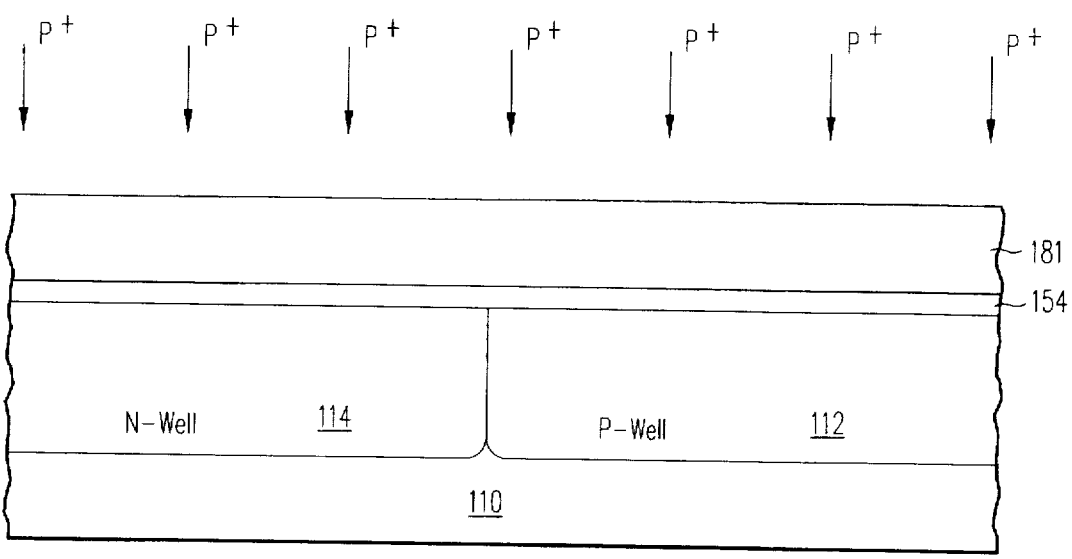
FIGS. 4a to 4d illustrate the formation of n-type and p-type polysilicon regions in a polysilicon layer using a single masking step in accordance with an alternative embodiment of the present invention.
Figure 4B:
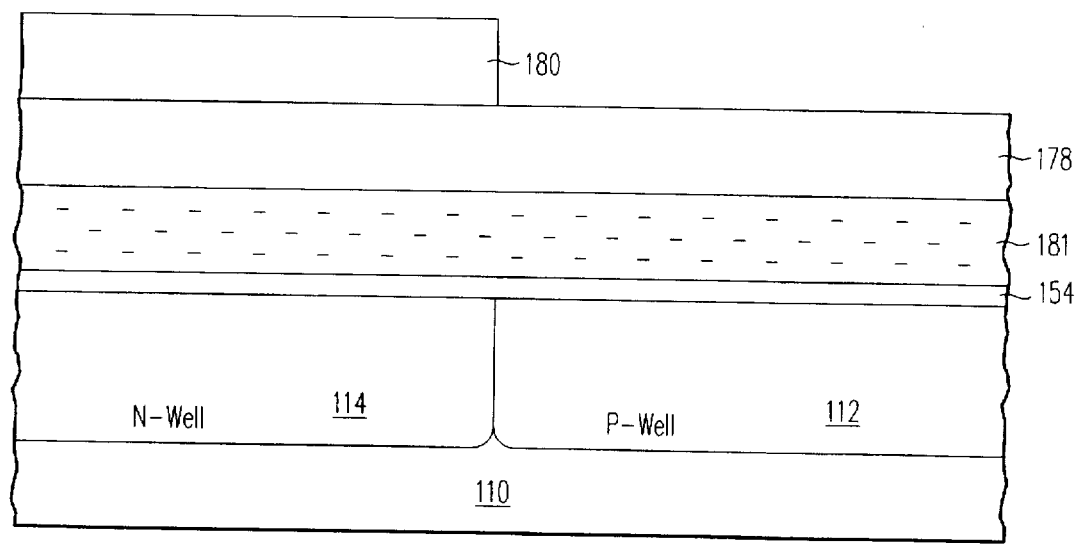
Figure 4C:
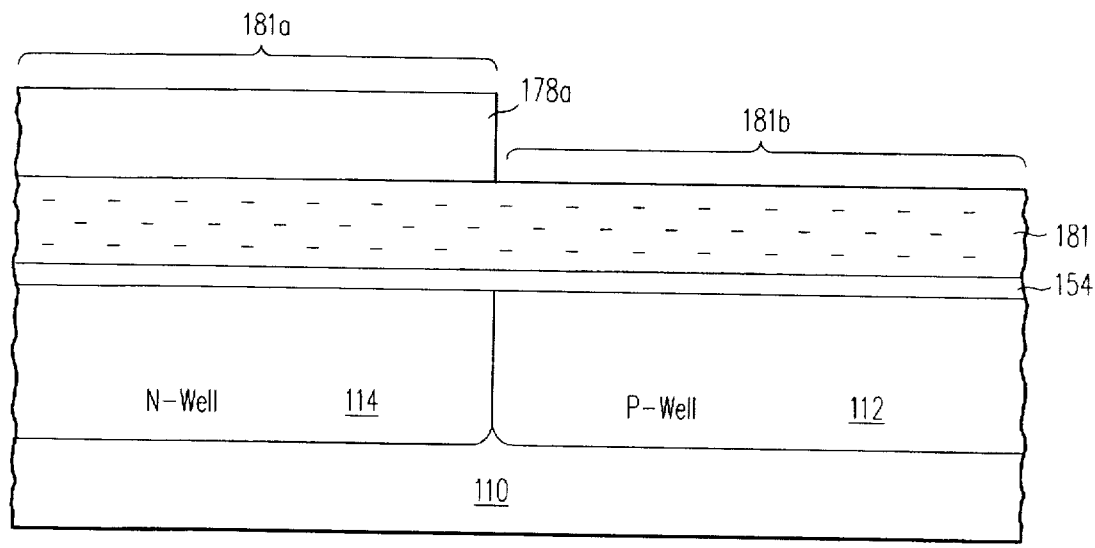

An alternative embodiment of the present invention is illustrated in FIGS. 4a to 4d. As shown in FIG. 4a, a substrate 110 is doped to form p-well 112 and n-well 114. An insulating layer 154 is formed over substrate 110 and a polysilicon layer 181 is formed over insulating layer 154. Polysilicon layer 181 is subjected to a blanket phosphorus implant, shown as P$^+$ in FIG. 4a, which renders polysilicon layer 181 to be n-type conductive. To attain the maximum phosphorus concentration in polysilicon layer 181, the maximum practical phosphorus implant dosage is used. Typically, the phosphorus implant dosage is approximately $1 \times 10^{16}$ atoms/cm$^2$ or less. Further, to prevent phosphorus ions from passing through polysilicon layer 181, insulating layer 154 and into the underlying p-well 112 and n-well 114, a relatively low implant energy is used for the blanket phosphorus implant. For example, an implant energy in the range of 20 kev to 30 kev is used.

After the blanket phosphorus implant, a first oxide layer 178 (FIG. 4b) is formed over polysilicon layer 181. A layer of photoresist is formed over first oxide layer 178, and a mask 180 is patterned from the photoresist to cover the region of first oxide layer 178 overlying n-well 114, resulting in the structure shown in FIG. 4b.

The exposed region of first oxide layer 178 is stripped (FIG. 4c) to expose a portion 181b of polysilicon layer 181 overlying p-well 112. Mask 180 is then stripped resulting in the structure shown in FIG. 4c with a portion 178a of oxide layer 178 remaining over a portion 181a of polysilicon layer 181 overlying n-well 114.

The exposed portion 181b, which was doped to n-type during the phosphorus implant, is then counter-doped to p-type using, in one embodiment, B$_2$H$_6$ as a diffusion source. Typically, the B$_2$H$_6$ diffusion cycle temperature and time are 850° C. and 30 minutes, respectively. The resulting structure, shown in FIG. 4d, has an n-type portion 181a of polysilicon layer 181 overlying n-well 114, and a p-type portion 181b of polysilicon layer 181 overlying p-well 112.

In alternative embodiments, instead of performing a blanket phosphorus implant (FIG. 4a) to render polysilicon layer 181 to be n-type conductive, a diffusion process is used. In one embodiment, POCl$_3$ is used as the diffusion source. To dope the bottom of polysilicon layer 181 to saturation, a relatively long diffusion cycle time is used. For example, a diffusion cycle temperature and time of 850° C. and 30 minutes, respectively, can be used.

In other embodiments, polysilicon layer 181 is rendered to be n-type conductive by performing a blanket arsenic implantation. Generally, the blanket arsenic implantation is performed using an implant dosage less than or equal to $1 \times 10^{16}$ atom/cm$^2$ and typically is performed using an implant dosage of $5 \times 10^{15}$ atoms/cm$^2$. Typically, a relatively low implant energy of 40 kev or less is used.

In an alternative embodiment, instead of doping portions 181a and 181b (FIG. 4d) to be n-type and p-type conductive, respectively, portions 181a and 181b are doped to be p-type and n-type conductive, respectively. This entails forming a photoresist mask over a region of oxide layer 178 (FIG. 4b) overlying p-well 112 (instead of forming mask 180 overlying n-well 114). The exposed region of oxide layer 178 is then removed to expose portion 181a of polysilicon layer 181 (instead of exposing portion 181b as in FIG. 4c). Then, the photoresist mask is stripped. Portion 181a is then counter-doped to be p-type conductive while the oxide remaining on portion 181b prevents counter-doping of portion 181b.

Figure 2C:
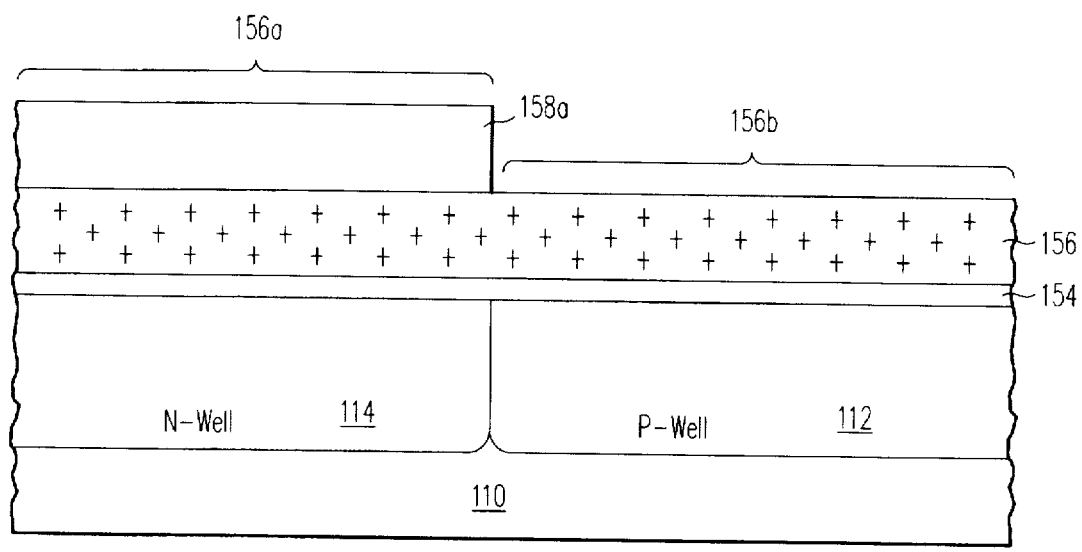
Figure 2D:
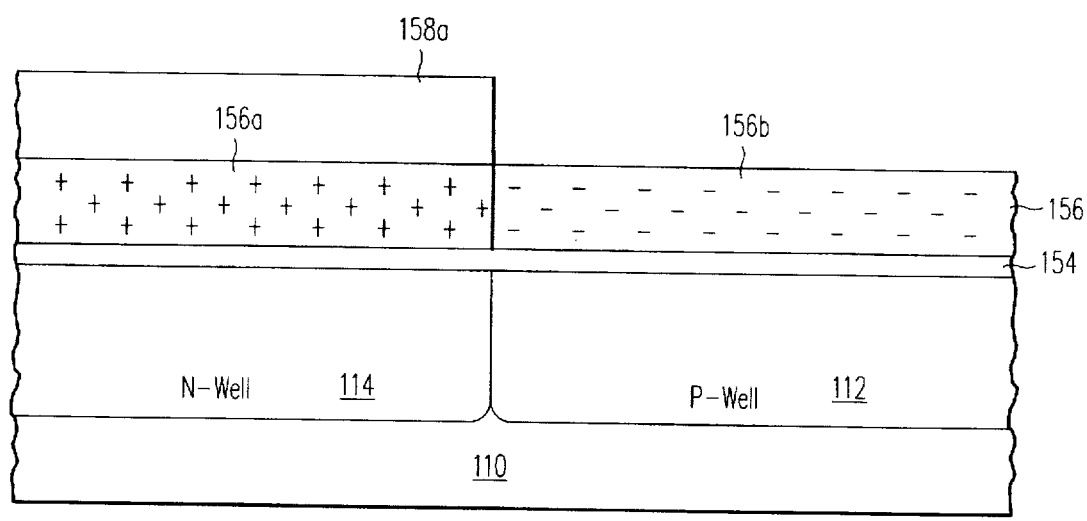

Referring to FIGS. 2a to 2d, the remaining portion 158a in FIG. 2c of first oxide layer 158 protects the underlying p-type portion 156a of polysilicon layer 156 from being counter-doped during the POCl$_3$ diffusion step which counter-dopes portion 156b to be n-type conductive (FIG. 2d). To provide adequate protection from counter-doping, the remaining oxide portion 158a, and hence the first oxide layer 158, must be sufficiently thick. The thickness at which first oxide layer 158 provides sufficient protection depends upon several factors.

One factor is the porosity of first oxide layer 158. The porosity determines the rate of POCl$_3$ diffusion through first oxide layer 158. The greater the porosity, the faster that POCl$_3$ diffuses through first oxide layer 158 and the thicker that first oxide layer 158 must be to prevent diffusion into, and counter-doping of, the underlying p-type portion 156a of polysilicon layer 156.

Another factor is the blanket boron implant dosage (illustrated in FIG. 2a). The boron concentration in polysilicon layer 156 is determined by the blanket boron implant dosage. As the boron implant dosage increases, the boron concentration in polysilicon layer 156 also increases. The boron concentration in turn determines the amount of POCl$_3$ diffusion through first oxide layer 158, and into the underlying p-type portion 156a of polysilicon layer 156 (FIG. 2c), which can be tolerated, with higher boron concentrations providing greater tolerances. Thus, by increasing the boron implant dosage, first oxide layer 158 can be made thinner since there is a greater tolerance to diffusion of POCl₃ through first oxide layer 158.

The thickness of first oxide layer 158 also depends upon the POCl₃ diffusion cycle temperature used to counter-dope portion 156b (FIG. 2d). At higher temperatures, the diffusion rate of POCl₃ through first oxide layer 158 increases. To offset the increase in diffusion rate, the thickness of first oxide layer 158 is increased. Conversely, at lower temperatures, the diffusion rate of POCl₃ through first oxide layer 158 decreases. The decrease in diffusion rate allows the thickness of first oxide layer 158 to be decreased. For example, at a POCl₃ diffusion cycle temperature of 900° C., first oxide layer 158 should have a thickness of approximately 2000 Å or greater. However for a POCl₃ diffusion cycle temperature of 850° C., first oxide layer 158 should have a thickness of only approximately 1000Å or greater. (The above example is provided for a chemical vapor deposition (CVD) deposited oxide and a diffusion cycle time of one hour.)

Although the thickness of first oxide layer 158 is discussed above in reference to preventing counter-doping of the underlying p-type portion 156a of polysilicon layer 156 during POCl₃ diffusion, it should be understood that the same thickness considerations are equally applicable to preventing counter-doping of the underlying n-type portion 181a (FIG. 4c) of polysilicon layer 181 during boron diffusion.

Upon completion of the methods set forth in the above embodiments shown in FIGS. 2a–2d and 4a–4d, processing continues until the desired device is formed. The p-type and n-type polysilicon portions can be patterned to form p-type and n-type polysilicon gates. Subsequently, n-type source/drain regions can be formed in p-well 112 thereby forming an n-channel device, and p-type source/drain regions can be formed in n-well 114 thereby forming a p-channel device.

Using the method set forth in the embodiment shown in FIGS. 4a–4d, n-channel devices with p-type polysilicon gates and p-channel devices with n-type polysilicon gates can be formed. Using the method set forth in the embodiment shown in FIGS. 2a–2d, n-channel devices with n-type polysilicon gates and p-channel devices with p-type polysilicon gates can be formed.

In one embodiment, the remaining portion (158a, 178a in FIGS. 2d, 4d, respectively) of first oxide layer (158, 178) is removed prior to patterning the p-type and n-type polysilicon regions to form the p-type and n-type polysilicon gates. This provides an identical environment during the polysilicon etch step for both p-type and n-type polysilicon regions. The identical environment minimizes the amount of overetching of underlying insulating layer 154 required to pattern the p-type and n-type polysilicon gates.

Figure 5:
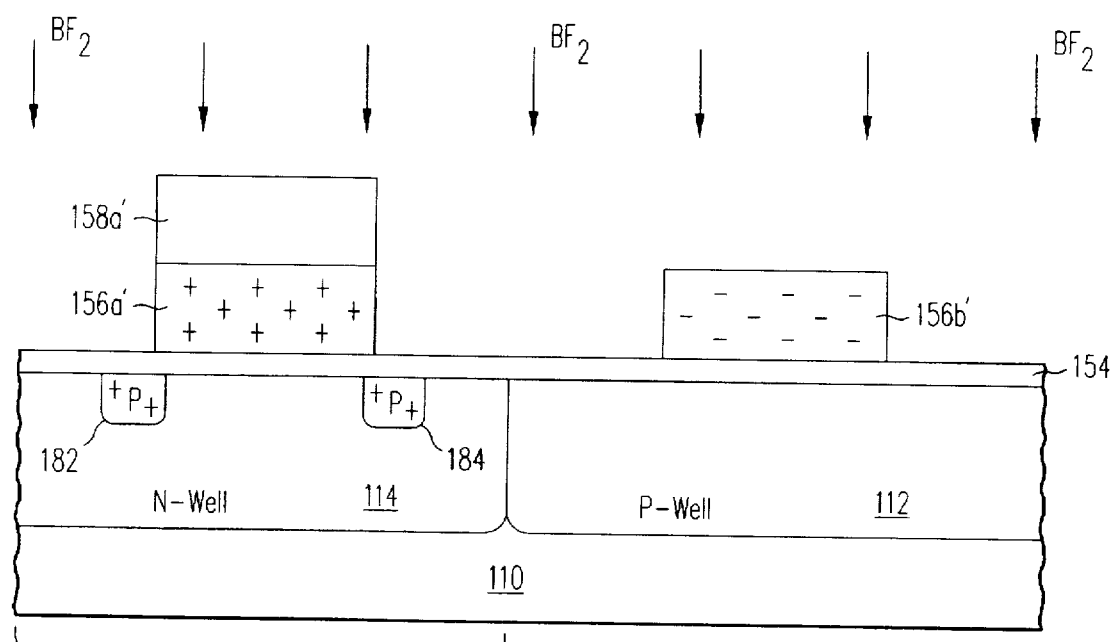
FIG. 5 illustrates an embodiment of the present invention wherein an oxide layer is used as a mask to reduce boron penetration into the underlying p-channel device during fabrication of p-type source/drain regions.

In an alternative embodiment, the first oxide layer remains for the rest of the device manufacturing process. The advantages of leaving the first oxide layer intact are described in reference to FIG. 5. FIG. 5 shows the structure of FIG. 2d wherein p-type polysilicon region (156a in FIG. 2d) and first oxide layer (158a in FIG. 2d) have been patterned to form p-type polysilicon gate 156a' with overlying first oxide layer 158a', and wherein n-type polysilicon region (156b in FIG. 2d) has been patterned to form n-type polysilicon gate 156b' by methods well known to those skilled in the art. The structure shown in FIG. 5 is appropriately masked (not shown) and subjected to a BF₂ ion implantation, shown as BF₂, to form p-type source/drain regions 182, 184, in p-channel device 186.

First oxide layer 158a' acts as a mask for p-type polysilicon gate 156a' during the BF₂ ion implantation, thereby preventing BF₂ ions from entering p-type polysilicon gate 156a'. Since there is no fluorine implanted into p-type polysilicon gate 156a', the prior art problem of boron penetrating through insulating layer 154, and the associated degradation of threshold voltage stability in p-channel device 186 is eliminated. This also eliminates the need for prior art thermal nitridation or nitrogen ion implantation of p-type polysilicon gate 156a' or insulating layer 154 and the associated degradation of p-channel mobility in p-channel device 186.

In alternative embodiments, the process is combined with thermal nitridation or nitrogen implantation of the polysilicon layer and/or the insulating layer. In one embodiment, thermal nitridation is performed using ammonia (NH₃) with a cycle temperature and time in the range of 900° C. to 1000° C. and 20 to 30 minutes, respectively. In another embodiment, nitrogen implantation is performed using an implant dosage of $1 \times 10^{14}$ atoms/cm² and an implant energy in the range of 20 to 40 kev.

Figure 4D:
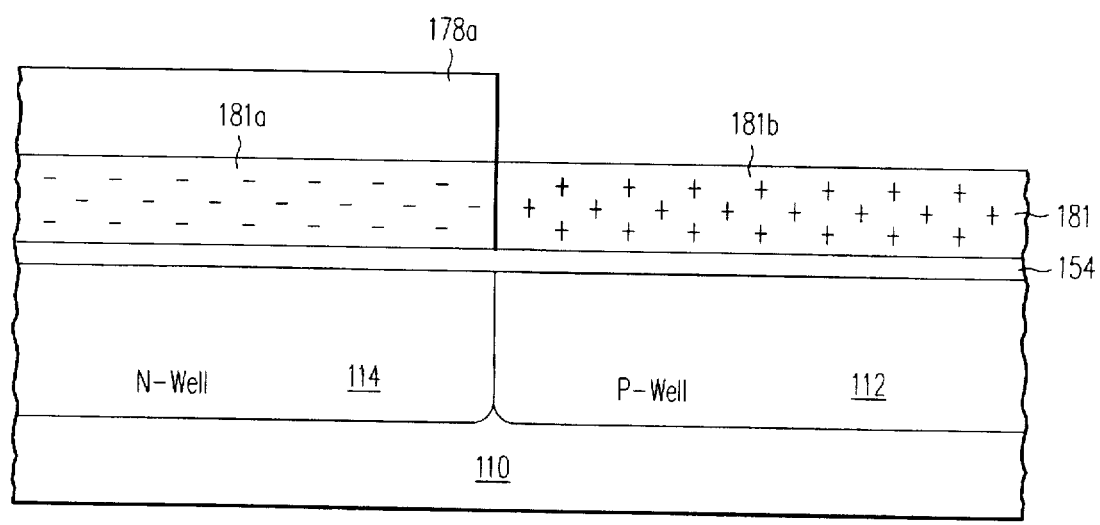

Although the advantages of having the first oxide layer remain for the rest of the device manufacturing process are discussed in reference to the structure shown in FIG. 2d, it should be understood that the advantages equally apply to the embodiment shown in FIG. 4d, wherein first oxide layer 178a acts as a mask similar to first oxide layer 158a in FIG. 2d'.

In an alternative embodiment, the first oxide layer is removed and a second oxide layer is formed on all of the polysilicon regions after the first oxide layer is removed. The second oxide layer provides an identical environment during the polysilicon etch step for both n-type and p-type polysilicon regions, thus minimizing overetching of insulating layer 154. The second oxide layer also acts as a mask which protects both p-type and n-type polysilicon gates during the formation of both p-type and n-type source/drain regions.

Using the methods set forth in the embodiments shown in FIGS. 2a–2d, 4a–4d, n-channel and p-channel devices having two different threshold voltages can be realized without adding a single process step. N-channel devices with n-type polysilicon gates have a threshold voltage that is about one volt lower than n-channel devices with p-type polysilicon gates. Also, p-channel devices with n-type polysilicon gates have a threshold voltage that is about one volt lower (one volt more negative) than p-channel devices with p-type polysilicon gates.

As discussed above, n-channel devices having n-type and p-type polysilicon gates can be formed using the methods set forth in the embodiments shown in FIGS. 2a–2d and FIGS. 4a–4d, respectively. The threshold voltage is approximately one volt less in the n-channel devices having n-type polysilicon gates formed using the method set forth in the embodiment shown in FIGS. 2a–2d than the n-channel devices having p-type polysilicon gates formed using the methods set forth in the embodiments shown in FIGS. 4a–4d.

As discussed above, p-channel devices having n-type and p-type polysilicon gates can be formed using the methods set forth in embodiments shown in FIGS. 4a–4d, and FIGS. 2a–2d, respectively. The threshold voltage shall be less by approximately one volt (one volt more negative) in the p-channel devices having n-type polysilicon gates formed using the method set forth in the embodiments shown in FIGS. 4a–4d than in the p-channel devices having p-type polysilicon gates set forth in the embodiments shown in FIGS. 2a–2d.

In accordance with the present invention, a single masking step method is provided for doping a portion of a polysilicon layer to p-type and a portion to n-type. The method allows the n-type portion of the polysilicon layer to be doped up to the saturation point of phosphorus in polysilicon. Further, n-channel devices with n-type or p-type polysilicon gates and p-channel devices with p-type or n-type polysilicon gates can be formed without having to add a single process step. Thus, n-channel and p-channel devices of two different threshold voltages can be realized without adding a single process step.

The method forms p-type and n-type portions of a polysilicon layer which have the same thickness thus providing an identical environment for subsequent polysilicon etch steps.

In certain embodiments, an oxide layer masks polysilicon gates during the formation of the source/drain regions. This is particularly advantageous when $BF_2$ is used to form shallow p-type source/drain regions since fluorine is prevented from implanting into the polysilicon gate and the associated threshold voltage instability is eliminated. Also, since fluorine is prevented from implanting into the polysilicon gate, thermal nitridation or nitrogen ion implantation is unnecessary and the associated degradation of p-channel mobility is avoided.

Although the present invention has been described with reference to preferred embodiments, those skilled in the art will recognize that changes may be made in form and detail without departing from the spirit and scope of the invention. For example, it is understood that other materials besides oxide, such as nitride, can be formed and patterned to prevent counter-doping of the underlying polysilicon portion. Thus, the invention is limited only by the following claims.

I claim:

1. A method of forming a semiconductor device comprising the steps of;

doping a polysilicon layer to a first conductivity type with a first dopant, said polysilicon layer being doped to the saturation point of said first dopant in polysilicon;

forming a patterned first layer over a first region of said polysilicon layer and leaving a second region of said polysilicon layer exposed; and counter-doping said second region of said polysilicon layer to a second conductivity type opposite said first conductivity type with a second dopant.

2. A method as in claim 1 wherein said first conductivity type is n-type and wherein said second conductivity type is p-type.

3. A method as in claim 2 wherein said first dopant is phosphorus and wherein said second dopant is boron.

4. A method as in claim 1 wherein said first conductivity type is p-type and wherein said second conductivity type is n-type.

5. A method as in claim 4 wherein said first dopant is boron and wherein said second dopant is phosphorus.

6. A method as in claim 1 wherein said step of doping said polysilicon layer to have said first conductivity type is performed by ion implantation.

7. A method as in claim 6 wherein said ion implantation is performed with an impurity ion dosage of $1 \times 10^{16}$ atom/$cm^2$ or less.

8. A method as in claim 6 wherein said ion implantation is performed using an implant energy which is insufficient to pass impurity ions through said polysilicon layer.

9. A method as in claim 1 wherein said step of doping said polysilicon layer to have said first conductivity type is performed by diffusion.

10. A method as in claim 1 wherein said step of counter-doping said second region of said polysilicon layer to have a second conductivity type is performed by diffusion.

11. A method as in claim 1 wherein said first layer is a first oxide layer.

12. A method as in claim 11 further comprising the step of stripping said first oxide layer.

13. A method as in claim 12 further comprising the step of forming a second oxide layer on said polysilicon layer.

14. A method as in claim 1 wherein said first layer has a thickness sufficient to prevent counter-doping of said first region of said polysilicon layer during said step of counter-doping said second region of said polysilicon layer.

15. A method of forming a semiconductor device comprising the steps of:

doping a polysilicon layer to a first conductivity type with a first dopant, said polysilicon layer being doped to the saturation point of said first dopant in polysilicon;

forming a first layer over said polysilicon layer;

forming a layer of photoresist over said first layer;

patterning a mask from said layer of photoresist over a first region of said first layer and leaving a second region of said first layer exposed;

stripping said second region of said first layer exposing a first region of said polysilicon layer and leaving a second region of said polysilicon layer covered;

stripping said mask; and counter-doping said first region of said polysilicon layer to a second conductivity type opposite said first conductivity type.

16. A method of forming a semiconductor device comprising the steps of:

doping a first region of a semiconductor substrate to a first conductivity type;

doping a second region of said semiconductor substrate to a second conductivity type opposite said first conductivity type;

forming an insulating layer over said semiconductor substrate;

forming a polysilicon layer over said insulating layer;

doping said polysilicon layer to said first conductivity type with a first dopant, said polysilicon layer being doped to the saturation point of said first dopant in polysilicon;

forming a patterned first layer over a first region of said polysilicon layer and leaving a second region of said polysilicon layer exposed; and counter-doping said second region of said polysilicon layer to said second conductivity type.

17. A method as in claim 16 further comprising the steps of:

patterning said first region of said polysilicon layer to form a first conductivity type gate and said second region of said polysilicon layer to form a second conductivity type gate;

forming first conductivity type source/drain regions in said second region of said semiconductor substrate;

forming second conductivity type source/drain regions in said first region of said semiconductor substrate.

18. A method as in claim 17 wherein said first layer is a first oxide layer.

19. A method as in claim 18 further comprising the step of stripping said first oxide layer before said step of patterning said first region and said second region of said polysilicon layer.

20. A method as in claim 19 further comprising the step of forming a second oxide layer on said polysilicon layer after said step of stripping said first oxide layer.

21. A method as in claim 17 wherein said first conductivity type source/drain regions are formed by boron flouride ion ($BF_2$) implantation.

22. A method as in claim 17 further comprising the step of thermal nitridation of said insulating layer.

23. A method as in claim 17 further comprising the step of thermal nitridation of said polysilicon layer.

24. A method as in claim 16 wherein said first region of said semiconductor substrate underlies said first region of said polysilicon layer and wherein said second region of said semiconductor substrate underlies said second region of said polysilicon layer.

25. A method as in claim 16 wherein said first region of said semiconductor substrate underlies said second region of said polysilicon layer and wherein said second region of said semiconductor substrate underlies said first region of said polysilicon layer.

26. A method of forming a semiconductor device comprising the steps of:

doping a polysilicon layer to a first conductivity type with a first dopant, said polysilicon layer being doped to the saturation point of said first dopant in polysilicon;

forming an oxide layer over said polysilicon layer;

patterning said oxide layer to form a first oxide portion over a first portion of said polysilicon layer, a second oxide portion over a second portion of said polysilicon layer and to expose third and fourth portions of said polysilicon layer; and counter-doping said third and fourth portions of said polysilicon layer to a second conductivity type opposite said first conductivity type.

27. A method as in claim 26 wherein said polysilicon layer is formed on a substrate having a first dopant region and a second dopant region, said first and third portions of said polysilicon layer overlying said first dopant region, said second and fourth portions of said polysilicon layer overlying said second dopant region.

28. A method as in claim 1 wherein said step of counter-doping said second region of said polysilicon layer to a second conductivity type dopes said second region of said polysilicon layer to the saturation point of said second dopant in polysilicon.

29. A method as in claim 1 wherein said first region of said polysilicon layer is doped to said first conductivity type and said second region of said polysilicon region is doped to said second conductivity type using a single masking step.

* * * * *